United States Patent [19]

Coleman

[11] Patent Number: 4,493,281

[45] Date of Patent: Jan. 15, 1985

[54] SHALLOW DEPTH LEAD WEIGHT EJECTION CIRCUIT

[75] Inventor: Jeffrey L. Coleman, San Diego, Calif.

[73] Assignee: The United States of America as represented by the Secretary of the Navy, Washington, D.C.

[21] Appl. No.: 481,520

[22] Filed: Apr. 1, 1983

[51] Int. Cl.³ .......................... F42B 19/00; B63G 9/04
[52] U.S. Cl. .................................. 114/20 R; 114/333
[58] Field of Search ...................... 114/20 A, 20 R, 25, 114/317, 331, 333; 441/28, 29; 367/1

[56] References Cited

U.S. PATENT DOCUMENTS

| | | | |
|---|---|---|---|
| 1,035,021 | 8/1912 | Laubeuf . | |
| 2,402,617 | 6/1946 | Fetzer et al. | 114/25 |
| 3,004,507 | 10/1961 | Abrams | 114/20 |
| 3,141,434 | 7/1964 | Billiard | 114/20 R |
| 3,153,394 | 10/1964 | Shaver et al. | 114/20 |
| 3,605,670 | 9/1971 | Dzikowski | 441/29 X |
| 3,716,009 | 2/1973 | Strickland | 114/333 |
| 3,818,523 | 6/1974 | Stillman, Jr. | 114/333 X |
| 4,200,920 | 4/1980 | Evans et al. | 367/1 |
| 4,300,254 | 11/1981 | Prior | 441/28 |

Primary Examiner—Charles T. Jordan
Assistant Examiner—Brian Steinberger
Attorney, Agent, or Firm—R. F. Beers; Ervin F. Johnston; Edmund W. Rusche, Jr.

[57] ABSTRACT

The invention is a safety circuit for torpedoes which causes lead weights to be ejected when the torpedo is not running and is below a predetermined depth. It uses a CMOS multivibrator and NAND gates to pulse power to the existing pressure transducer and a comparator. This comparator checks depth and alternator power. When conditions are met, it holds power on and after five seconds, causes the weights to be dropped.

The circuit is powered by existing batteries in the torpedo exercise head. To minimize any effect on the battery life, a strobbing technique is used where voltage is switched on for only a few milliseconds once every ten seconds. Depth is checked by the use of the comparator. One comparator input is connected to the torpedo's depth transducer and the other to a reference voltage in accordance with the predetermined depth limit. When the transducer voltage exceeds the reference voltage, the comparator turns on.

One output from the comparator then latches-on for as long as the comparator is on. A second output from the comparator controls the lead weight dump switch. The output is inhibited from turning on the dump switch for five seconds after the comparator activates by a series pass transistor. Following a valid five second period the dump relay switch releases the lead weights.

10 Claims, 4 Drawing Figures

SHALLOW DEPTH LEAD WEIGHT EJECTION CIRCUIT

STATEMENT OF GOVERNMENT INTEREST

The invention described herein may be manufactured and used by or for the government of the United States of America for governmental purposes without the payment of any royalties thereon or therefor.

BACKGROUND OF THE INVENTION

In test firings of MK-46 Torpedoes, failures sometimes prevent the engine from running property. Back-up safety devices and methods have been developed to aid in recovering a torpedo which has failed during operation. In particular, electronic and mechanical means have been designed to control the torpedo's operation for preventing it from going below select depths, and also to release weight systems in order to allow the torpedo to return to the surface for retrieval.

Presently, there are two principal circuits being used to eject lead weights from a failed torpedo. The depth cutoff (DCO) circuit is activated whenever the torpedo reaches a preset depth. Unfortunately, to prevent interference with the tests, the DCO depth must usually be set quite deep where high pressure could cause other system failures. Also, the time required after failure for the torpedo to sink to DCO depth, then rise to the surface, could permit the torpedo to drift out of range of the recovery crew.

The second lead weight ejection circuit in current operation, is the Power Failure Circuit. This circuit ejects the lead weights if, after the engine has run approximately ten seconds or more it then stops. However, if the engine fails within the first ten seconds, the circuit does nothing.

SUMMARY OF THE INVENTION

This invention is designed to act in early failure cases for ejecting lead weights so that the torpedo will rise to the surface and be easily recovered. More particularly, this invention is designed to take effect within the first few seconds of operation of a test torpedo. It is within this period of time, before another present circuit takes effect, than an effective safety recovery system is required.

Specifically, it is a circuit for causing weights to be dropped from a test fired torpedo when it malfunctions, causing it to rise to the surface of the water. It will operate accurately at a shallow depth, allowing the torpedo to be recovered sooner. It does not require an engine start, and thereby prevents unnecessary sinking and possible loss of a torpedo which completely misfires. It also serves as a backup safety system to present systems designed to recover test torpedos following test operations.

The circuit centers around a comparator which compares input voltages from the depth transducer (which is proportional to the depth of the torpedo) with a preset voltage corresponding to a trigger depth at which the weights are to be released. An alternating square wave signal with a preset time constant is generated by an astable multivibrator. This signal is further modified by a monostable multivibrating circuit to emit a one millisecond pulse once each period of the signal emitted by the astable multivibrator. This millisecond pulse is fed through a power switch circuit which initiates power-on to the comparator, and also addresses the preset voltage level generated to be compared against the transducer's voltage.

The comparator also responds to a control circuit which is designed to inhibit operation of the comparator as long as the torpedo is functioning with its general power source active. If the torpedo's general power source fails, the comparator is no longer inhibited from operation and the power switch will power-on the comparator for making a comparison between the transducer voltage and the preset voltage. If the transducer voltage indicates a depth equal to or greater than the preset voltage level corresponding depth, the comparator outputs a signal back into the input of the power switch to then lock on. This, accordingly, causes the comparator to remain on. Simultaneously, power from the power switch is input into a gate and delay circuit along with an input from the astable multivibrator. The gate and delay circuit will cause a delay of five seconds to occur before it will emit an activation signal to a dump switch. The dump switch, having already been turned on by the comparator, will release the lead weights when activated by the signal from the gate and delay circuit output. The five second delay incorporated into the gate delay circuit function is to protect against spurious noise or other undesired signals accidentally triggering dumping of the lead weights.

OBJECTS OF THE INVENTION

An object of this invention is to provide a safety circuit which controls the release of lead weights upon failure of a test torpedo.

A second object of the invention is to provide a safety circuit designed to eject lead weights upon the failure of a test torpedo during the first few seconds of a test run.

Another objective of this invention is to present a safety circuit for releasing lead weights from a test torpedo upon failure of the torpedo during a test run whereby said circuit draws a very minimum of current from the torpedo power system.

A further objective of this invention is to present a safety circuit designed to control the release of lead weights upon failure of a torpedo during a test run and upon failure of other primary safety circuits in the test torpedo.

A further objective of the invention is to present a safety circuit controlling the release of lead weights upon failure of a test torpedo whereby a safety circuit makes use of existing depth transducers with no modifications and with complete compatibility with existing systems.

These and other objects of the invention will become more readily apparent from the ensuing description when taken with the appended claims and drawings.

DESCRIPTION OF THE PREFERRED EMBODIMENT

Figure 1:
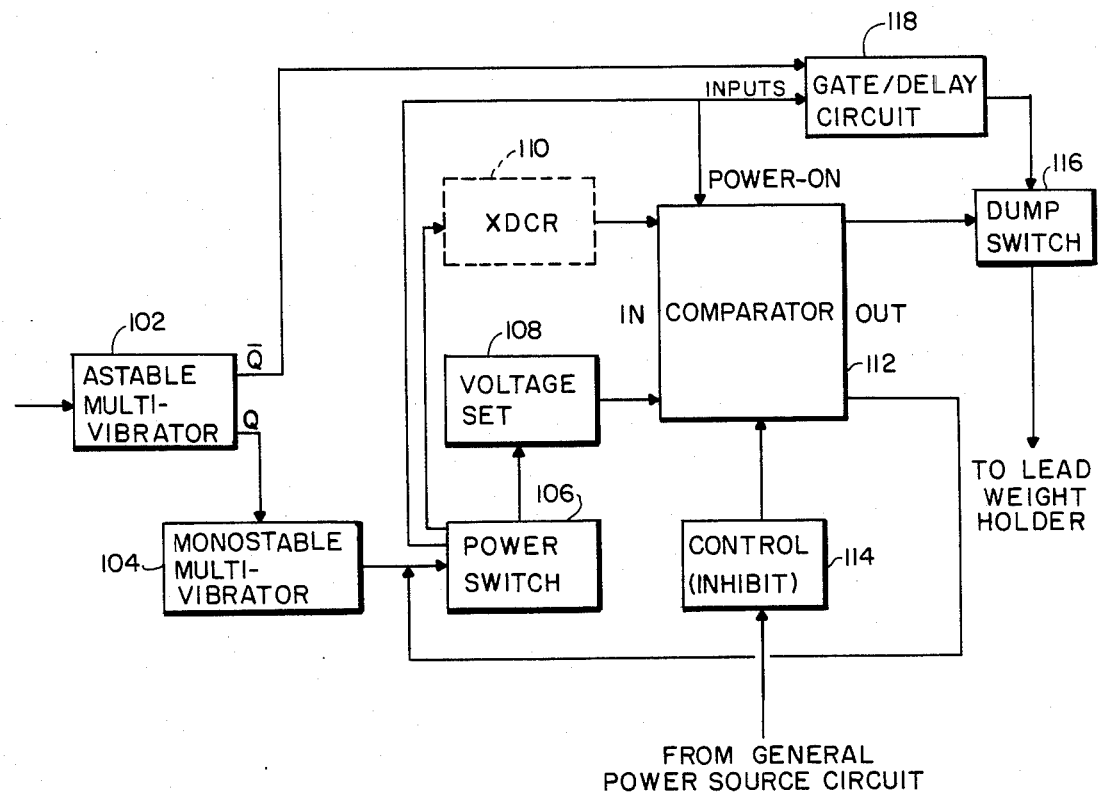
FIG. 1 is a schematic block diagram of the shallow depth lead weight ejection circuit.

FIG. 1, in a schematic form, shows a general block diagram for the lead weight ejection circuit. Power provided through the input of an astable multivibrator 102 is converted into a sqaure wave output through terminals $\bar{Q}$ and Q. The period of the output is adjusted to a value of ten seconds for the preferred embodiment. For five seconds of this period terminal $\bar{Q}$ will be at the high potential while Q is at the low potential, and then for the following five second phase, Q reverses to the high potential with $\bar{Q}$ at the low potential. The output from $\bar{Q}$ feeds a monostable multivibrator 104 which further processes the signal to produce a one millisecond pulse every ten seconds. The one millisecond pulse activates a power switch 106.

Power switch 106 is connected to power-on a comparator 112 when the power switch has been activated. The power switch also provides an input signal to a gate and delay circuit 118. When the power switch has been activated it provides an output signal which induces a voltage-set circuit 108 to establish a preset voltage level on one input to comparator 112. This preset voltage will be compared against a voltage input from a depth transducer 110 contained in the torpedo system. The power switch also sends power to transducer 110.

However, even though power switch 106 can emit a signal which will power-on comparator 112, such will not occur if a control circuit 114 is active and inhibits comparator 112 from being turned on. Control circuit 114 is connected to monitor the power from the general power source circuit of the torpedo. Should this power source drop to zero because of a torpedo failure, control circuit 114 drops its inhibition control on comparator 112. At such time comparator 112 is susceptible to being powered-on by power switch 106.

When such a condition occurs, i.e., the torpedo general power source circuit has failed, the one millisecond monostable multivibrator output through power switch 106 powers on comparator 112 to make a comparison check of the voltage inputs from transducer 110 and voltage-set 108. Should transducer 110 voltage occur at a level which represents a depth greater than the preset voltage in voltage-set 108, comparator 112 is activated to output control signals. One control signal feeds back to the input of power switch 106. A second control signal is output to power-up a dump switch 116. The control signal to power switch 106 causes the switch to latch on, thereby providing a continuous power-on condition for comparator 112. This will keep the comparator output to dump switch 116 active for maintaining the dump switch ready for operation.

However, the output of power switch 106 also inputs to gate/delay circuit 118 which must emit the control signal which will cause dump switch 116 to release the lead weights. Gate/delay circuit 118 monitors input $\bar{Q}$ from astable multivibrator 102. The delay circuit causes a five second delay between the input of power switch 106 and the input from $\bar{Q}$. This delay protects against accidental activation of dump switch 116 as might be caused by spurious or transient signals. When five seconds have elapsed, gate/delay circuit 118 emits the output control pulse to dump switch 116. Dump switch 116 then emits an output control pulse to the lead weight holder which releases the weights allowing the torpedo to float to the surface.

Figure 2:
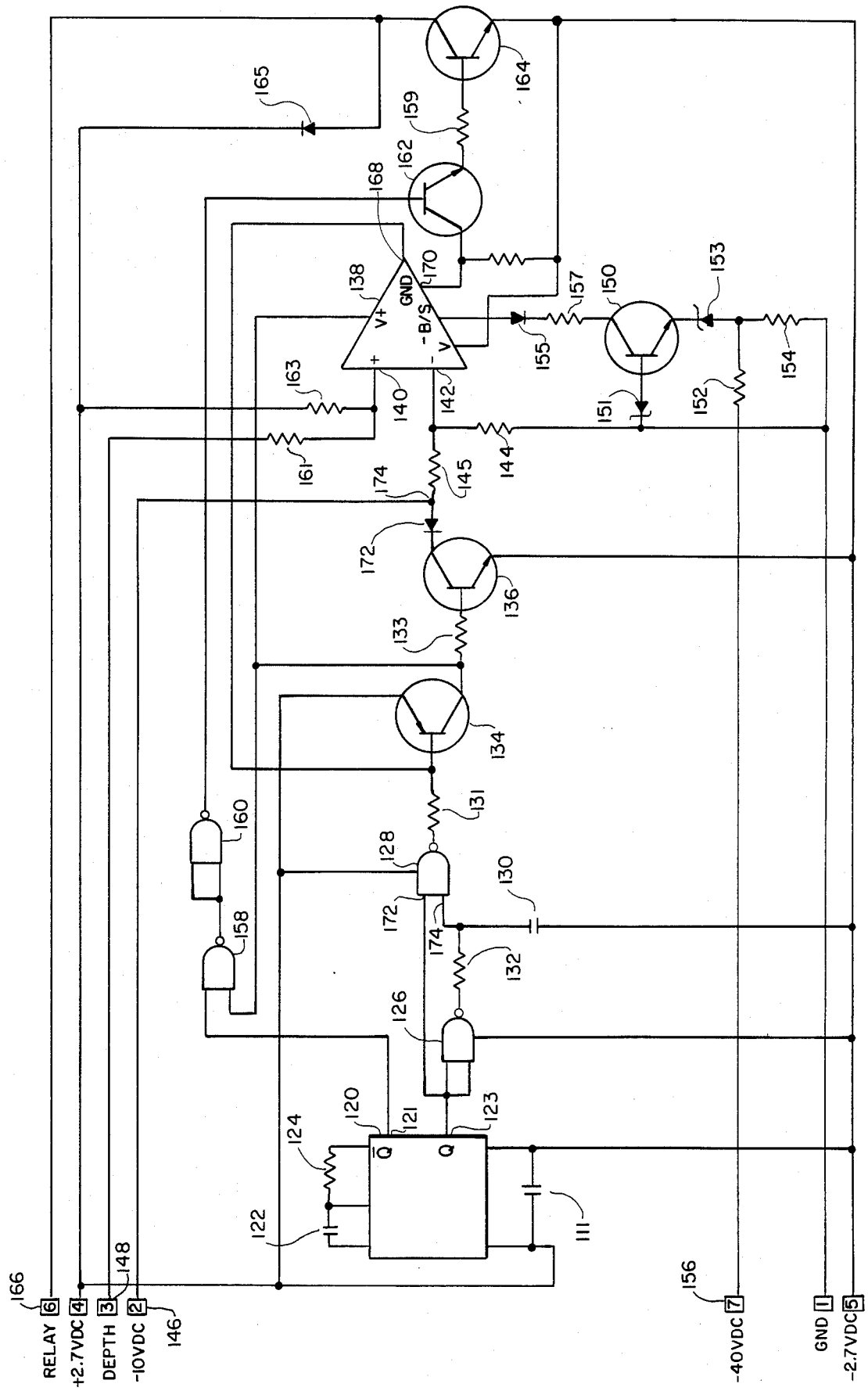
FIG. 2 is a detailed schematic of the circuit described for the preferred embodiment of the invention.

FIG. 2 is a detailed wiring diagram of the circuit as actually utilized in this preferred embodiment. An astable multivibrator 120, a capacitor 122, and a resistor 124 form a multivibrator with a period of approximately ten seconds. The non-inverted output of 120 is fed into NAND gates 126 and 128. On the rising edge of this signal, input 172 of gate 128 is pulled high. Input 174 of NAND gate 128 is pulled low, but only after a delay of approximately one millisecond as created by a resistor 132 and a capacitor 130. Consequently, the output of gate 128 will go low for one millisecond every two seconds.

Figure 4:
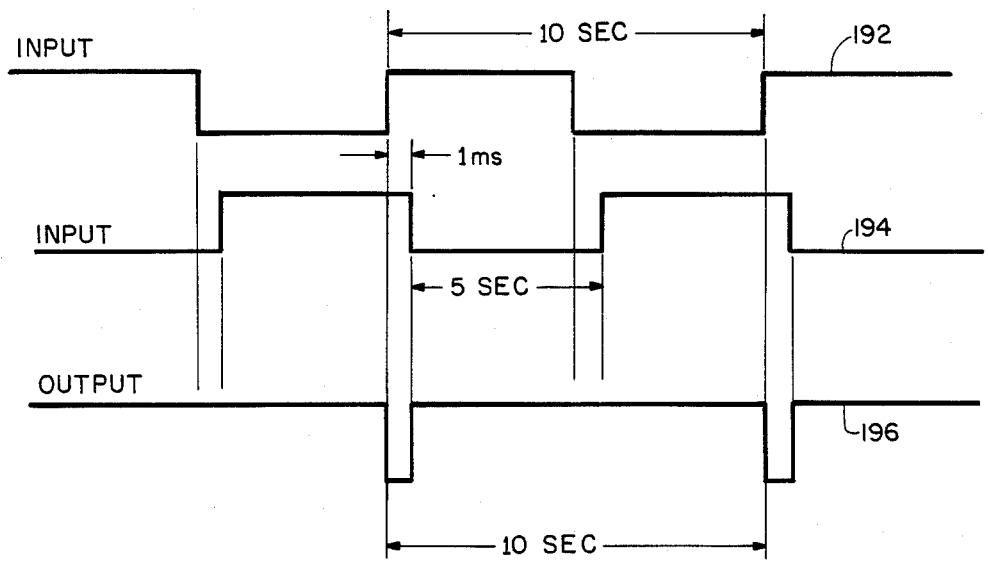
FIG. 4 displays input and output waveforms from the monostable multivibrator circuit.

FIG. 4 shows the waveform combinations creating the output signal from gate 128. Waveform 192 represents the ten second period wave at input 172. Waveform 194 represents the signal input 174. NAND gate 128 will act when waveforms are high by emitting an inverted waveform during this period. This process creates the one millisecond pulse every ten seconds. NAND gate 126 serves the function of inverting a signal output from Q prior to its delay and input into NAND gate 128.

The one millisecond periodic pulse is then connected to the base of a transistor 134. During the one millisecond low pulse, current will be drawn through the base of transistor 134, turning it on, and thus providing power to a comparator 138 and current to turn on a transistor 136. Transistor 136 then provides a negative potential on a −10 volt DC line 146 which is connected to the torpedo pressure or depth transducer. It is important to note that this −10 volt signal will occur while the torpedo engine and power circuit is operating. Upon failure of the torpedo engine, this voltage will disappear and the signal transmitted through terminal 146 will power the depth transducer. When transistor 136 is on, current will be drawn from terminal 146 through a diode 172 and through resistors 145 and 144. Diode 172 establishes a voltage at contact point 174 such that resistors 145 and 144 can act as a voltage divider for establishing preset voltage to a terminal 142 of comparator 138. This preset voltage is set to be equivalent to the depth transducer measuring approximately 108 p.s.i. (a depth of 242 feet).

With the condition of the torpedo circuit in a failed mode the voltage on the depth line 148 will then be dependent upon the pressure applied to the transducer with greater pressure causing a more negative voltage to appear. When the pressure equals approximately 108 p.s.i., the voltage on the depth line will equal the voltage from the voltage divider created by resistors 145 and 144. At this point, comparator 138 will emit control signals.

Comparator 138 will turn on and begin conducting current from pin 168 to 170. This current flow serves two purposes. Since the current must flow through transistor 134, that transistor becomes locked on even after the original one millisecond pulse from NAND gate 128 ends. The current flow also raises the potential at the collector of a transistor 162.

Consequently, transistor 134 becomes latched on and thereby continues to power comparator 138. Simultaneously, transistor 134 provides a signal to one input of a NAND gate 158. A second signal gate 158 is received from output 121 of multivibrator 120. It can be seen that if transistor 134 is only turned on for one millisecond, the inverted output at 121 of multivibrator 120 will be low during the entire time the collector of transistor 134 is high and the output of gate 158 will not go low. But, if transistor 134 is held on by comparator 138 for more than five seconds, the inverted output from the multivibrator will toggle high and thus both inputs to gate 158 will be high driving the output low. A NAND gate 160 is used as an inverter so when the gate 158 output goes low, NAND gate 160 output goes high turning on the base of transistor 162. This turns on a transistor 164 which drives a relay 166 causing the weights to be ejected.

The above operating procedure will only occur when comparator 138 is free to operate and function. If the torpedo engine and general power circuit is functioning properly as monitored through resistors 152 and 154 serving as voltage dividers, a transistor 150, selenium rectifiers 151 and 153, a diode 155, and a resistor 157, the comparator 138 is inhibited from operating or responding to a power-on signal from transistor 134. Upon failure of the torpedo engine and the voltage in the power circuit, the −40 volts DC at terminal 156 collapses and the function of this inhibiting circuit removes its control from comparator 138. Comparator 138 will then be able to respond to power signals from transistor 134, and the entire safety circuit can function as planned to release lead weights.

A capacitor 111 is just a filter capacitor. Resistors 131, 133, 157, and 159 limit currents. Resistors 161, 152, 154, and diodes 172, 155, and 153 limit undesired currents. A resistor 163 prevents the circuit from actuating when the transducer is disconnected. A diode 165 protects transistor 164 from voltage spikes.

This circuit will eject the lead weights at approximately 242 feet of sea water which is much shallower than the depth cutoff circuit depth in most cases. It does not require the engine to run as does the power failure circuit. Extremely low power consumption is achieved by using CMOS components where possible and by selective switching of power to the comparator. This allows the existing DCO battery to be used to power the circuit. The existing depth transducer is used with no modifications and complete compatibility with existing systems is maintained. Accidental firing is almost impossible due to the incorporation of a five second delay in addition to the inherent delay of the relay being driven.

Figure 3:
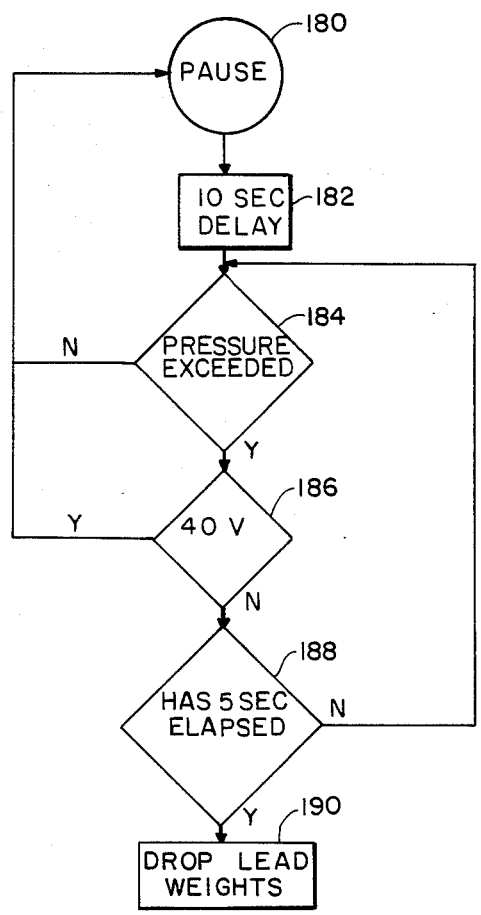
FIG. 3 is a logic decision chart showing the function of the circuit.

FIG. 3 shows the decision logic in the time sequence followed for operation of this circuit. The start state is a pause state 180. A ten second delay is established as indicated by block 182. Block 184 addresses the question as to whether the pressure that is present has been exceeded. If the answer is "no" we trace ourselves back to pause block 180. If the answer is "yes", we continue to block 186 where the question tests if the 40 volt power circuit is operating. If "yes", we again find ourselves back at pause block 180. If the power circuit is off and the answer to that question is "no", we proceed to block 188 and await a five second delay. If five seconds does not elapse we exit through the "no" port and return to block 184 to retest the pressure level. If five seconds has elapsed a "yes" answer occurs, and the lead weights are dropped as indicated by block 190.

Obviously, many modifications and variations of the present invention are possible in the light of the above teachings. It is therefore to be understood that within the scope of the appended claims the invention may be practiced otherwise than as specifically described.

What is claimed is:

1. A circuit for ejecting ballast weights when an underwater, self-powered vehicle fails during operations which comprises:

means, connected to receive a voltage level signal representing the actual depth of the submersible vehicle and a preset reference voltage level signal representing a predetermined depth limit, for comparing both voltage level signals and emitting output signals when the actual depth is greater than the depth limit;

means, connected to receive power from the submersible's basis power source, for forming a periodic signal with a predetermined period T;

means, connected to receive the periodic signal from the forming means, for establishing a short pulse signal output of duration t much less than T, and with the same period T;

means, connected to receive the output short pulsed signal from the establishing means and an output signal from the comparing means, for switching on power at its output, said output power being in the form of the short pulsed signals when no input occurs from the comparing means but being in a continuous form when the comparing means is transmitting a signal to said switching means, said switching means output connected to the comparing means for powering-up the comparing means during periods when the switching means emits output signals;

means, connected to the output of the switching means and connected to receive power from the submersible vehicles basic power source, for setting the preset reference voltage level at its output to be input to the comparing means;

means, connected to monitor the submersible vehicle's operational power circuit, for inhibiting operation of the comparing means when the operational power circuit is functioning properly, said inhibiting means having an output connected to the comparing means for transmitting the inhibiting signal;

means, connected to receive the periodic signal from the forming means and the signal output from the switching means, for gating a command signal of a predetermined delay at its output; and means, connected to the output of the comparing means and to the output of the gating means, for dumping the ballast, said dumping means being powered on by the signal output from the comparing means and being later activated to release the ballast by the command signal from the gating means.

2. A circuit according to claim 1 wherein the switching means further comprises:

a power output connected to the underwater vehicle's depth transducer for providing power to said transducer when the operational power circuit fails.

3. The circuit according to claim 2 further comprising:

a battery of the underwater vehicle as the basic power source from which said ejection circuit obtains its power.

4. A circuit according to claim 3 for ejecting ballast weights wherein the underwater, self-powered vehicle is a torpedo.

5. A circuit for ejecting ballast weights when an underwater, self-powered vehicle fails during operations which comprises:

an astable multivibrator connected to receive power from the basic power source of the underwater vehicle, and connected in parallel with a first RC circuit to establish that the output signal from said astable multivibrator will be periodic at a predetermined period T;

a first NAND gate having both input terminals connected to a first output terminal of the astable multivibrator to receive the periodic signal, said NAND gate inverting the input signal;

a second NAND gate having a first input terminal connected to the first output terminal of the astable multivibrator and having a second input terminal connected to receive the output signal of the first NAND gate;

a second RC circuit connected between the output of the first NAND gate, the basic power source, and the second input of the second NAND gate, said second RC circuit adjusted to cause a delay in the signal output from the first NAND gate of a predetermined amount;

a PNP transistor having its base connected to the output of the second NAND gate, and having its emitter connected to the positive side of the basic power source;

a first NPN transistor having its base connected to the collector of the PNP transistor, having its emitter connected to the low side of the basic power source, and having its collector connected to one side of the underwater vehicle's depth transducer;

a voltage dividing network connected with a first terminal of the collector of the first NPN transistor, connected with a second terminal to a ground point, and fitted with an output terminal adjusted to emit a preselected voltage level;

a comparator with a first input connected to the output terminal of the voltage divider, and a second input connected to a terminal of the depth transducer which transmits a voltage that is sensitive to the depth of the underwater vehicle, said comparator being enabled to emit output signals when the voltages compared at the input terminals indicate the underwater vehicle is below a preset limit depth represented by the output voltage of said voltage divider, said comparator connected to emit an output signal to the base of the PNP transistor, said comparator connected to receive a signal from the collector of said PNP transistor whereby said received signal will turn on said comparator for operation if said comparator is not otherwise inhibited from operating;

means, connected between the underwater vehicle's operational power circuit and the comparator, for inhibiting operation of the comparator when the operational power circuit is functioning properly;

a third NAND gate with its first input terminal connected to the second output of the astable multivibrator and its second input terminal connected to the collector of the PNP transistor, said NAND gate emitting an output signal when its two inputs are low;

a second NPN transistor with its base connected to the output of the third NAND gate and its collector connected to an output of the comparator, said transistor being activated while the comparator is active and a control signal has been emitted from the output of the third NAND gate;

a third NPN transistor with its base connected to the emitter of the second NPN transistor and its emitter connected to the negative side of the basic power source, said transistor when activated by a signal from the emitter of the second NPN transistor emits a command signal at its collector terminal; and means, connected to receive the command signal emitted at the collector of the third NPN transistor, for releasing the weights upon receipt of said command signal.

6. A circuit according to claim 5 further including:

a fourth NAND gate with both inputs connected to receive the output of the third NAND gate, and with its output connected to the base of the second NPN transistor, said NAND gate serving to invert the signal output from the third NAND gate.

7. A circuit according to claim 6 for ejecting ballast weights wherein the underwater, self-powered vehicle is a torpedo.

8. A circuit according to claim 5 further including:

a resistor connected between the output of the second NAND gate and the base of the PNP transistor;

a second resistor connected between the collector of the PNP transistor and the base of the first NPN transistor;

a third resistor connected between a depth sensitive voltage terminal of the underwater vehicle's depth transducer and the first input to the comparator;

a fourth resistor connected between the collector of the second NPN transistor and the negative side of the basic power source;

a fifth resistor connected between the emitter of the second NPN transistor and the base of the third NPN transistor;

a sixth resistor connected between the first input of the comparator and the positive side of the basic power source;

a first diode connected between the collector of the first NPN transistor and the first terminal of the voltage divider, said diode oriented to block current flowing from the collector of said transistor;

a second diode placed between the collector of the third NPN transistor and the positive side of the basic power source, said second diode oriented to block current flowing to the collector of said transistor;

a third diode connected between the comparator and the means for inhibiting, said diode oriented to block current from entering the comparator.

9. A circuit according to claim 8 further including:

a fourth NAND gate with both inputs connected to receive the output of the third NAND gate, and with its output connected to the base of the second NPN transistor, said NAND gate serving to invert the signal output from the third NAND gate.

10. A circuit according to claim 9 for ejecting ballast weights wherein the underwater, self-powered vehicle is a torpedo.

* * * * *